(12) United States Patent
Hsu et al.

(10) Patent No.: US 9,595,570 B2
(45) Date of Patent: Mar. 14, 2017

(54) DISPLAY DEVICE

(71) Applicant: Japan Display Inc., Tokyo (JP)

(72) Inventors: Hsiang Lun Hsu, Tokyo (JP);
Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/172,242

(22) Filed: Jun. 3, 2016

(65) Prior Publication Data

US 2016/0365390 A1 Dec. 15, 2016

(30) Foreign Application Priority Data

Jun. 10, 2015 (JP) .................. 2015-117296

(51) Int. Cl.
*H01L 27/32* (2006.01)
*H01L 51/52* (2006.01)
*H01L 51/56* (2006.01)
*H01L 25/04* (2014.01)
*H01L 27/12* (2006.01)

(52) U.S. Cl.
CPC ........ *H01L 27/3211* (2013.01); *H01L 25/048* (2013.01); *H01L 27/1214* (2013.01); *H01L 27/322* (2013.01); *H01L 27/3202* (2013.01); *H01L 27/3244* (2013.01); *H01L 51/5212* (2013.01); *H01L 51/5218* (2013.01); *H01L 51/5246* (2013.01); *H01L 51/56* (2013.01); *H01L 27/3246* (2013.01); *H01L 2227/323* (2013.01)

(58) Field of Classification Search
None
See application file for complete search history.

(56) References Cited

U.S. PATENT DOCUMENTS

| 2013/0001620 A1* | 1/2013 | Sugisawa | H01L 27/3276 257/98 |
| 2013/0299789 A1* | 11/2013 | Yamazaki | H01L 51/5246 257/40 |
| 2014/0110735 A1 | 4/2014 | Sato et al. | |
| 2015/0069362 A1* | 3/2015 | Ito | H01L 27/323 257/40 |
| 2015/0263076 A1* | 9/2015 | Seo | H01L 27/3213 257/40 |
| 2015/0362795 A1* | 12/2015 | Chen | G02F 1/133514 349/42 |

FOREIGN PATENT DOCUMENTS

| JP | H0714995 A | 1/1995 |
| JP | 2006-162706 A | 6/2006 |
| JP | 2014-086259 A | 5/2014 |

* cited by examiner

*Primary Examiner* — Minh-Loan Tran
(74) *Attorney, Agent, or Firm* — Typha IP LLC

(57) ABSTRACT

A display device includes a reflection electrode located on a first substrate; a pixel electrode located above the reflection electrode; a common electrode located above the pixel electrode; a light emitting layer located between the pixel electrode and the common electrode; a first color filter located above the common electrode, the first color filter being green or red; and a second color filter located at a position overlapping the first color filter as seen in a plan view, the second color filter being yellow.

19 Claims, 18 Drawing Sheets

DISPLAY DEVICE

CROSS REFERENCE TO RELATED APPLICATIONS

This application is based upon and claims the benefit of priority from the prior Japanese Patent Application No. 2015-117296 filed on Jun. 10, 2015, the entire contents of which are incorporated herein by reference.

FIELD

The present invention relates to a pixel structure of a display device.

BACKGROUND

An organic electroluminescence (hereinafter, referred to as "organic EL") display device includes a light-emitting element provided in each of pixels and displays an image by controlling light emission of each of the light-emitting elements individually. The light emitting-element has a structure in which a layer containing an organic EL material (hereinafter, also referred to as a "light-emitting layer") is interposed between a pair of electrodes, one of which is a pixel electrode and the other of which is a common electrode. In such an organic EL display device, one of the electrodes is provided in each pixel as the pixel electrode, and the other electrode is provided over a plurality of pixels as the common electrode supplied with a common potential. The organic EL display device provides a potential of the pixel electrode provided in each pixel individually with respect to the potential of the common pixel electrode, and thus controls the light emission of the pixels.

A display device, especially, a display device realizing full-color display with a combination of a white light emitting element and color filters, generally includes an array substrate (also referred to as a "TFT substrate") and a counter substrate (also referred to as a "color filter substrate") that are assembled together. The array substrate includes a plurality of light emitting elements arrayed in rows and columns. The color filter substrate includes color filters of three colors, namely, R (red), G (green) and B (blue) arranged side by side, and a light-blocking layer demarcating the color filters of the three colors.

In the case where the pixel electrodes are formed of a metal material having a high reflectance, there is a case where external light incident on the display device through the color filters is reflected at a surface of the pixel electrodes, and as a result, the reflected light is brighter than a displayed image. In this case, a display degradation occurs; namely, the displayed image is difficult to be visually recognized. Such a display degradation is especially a serious problem when the display device is used outdoors.

For example, Japanese Laid-Open Patent Publication No. 2014-086259 discloses a display device as follows in order to provide a sufficient level of luminance and contrast and make it difficult to cause color mixing even in the case where the pixels are microscopic. In this display device, a color filter of the same color as the color filter included in the color filter substrate is provided between a reflection electrode and a pixel electrode in each of a plurality of pixels. However, with this structure, external light incident on the display device is merely visually recognized as reflected light after passing the two color filters of the same color. The reflection of the external light is not alleviated, and thus the problem of the display degradation is not solved.

SUMMARY

An embodiment according to the present invention is directed to a display device including a reflection electrode located on a first substrate; a pixel electrode located above the reflection electrode; a common electrode located above the pixel electrode; a light emitting layer located between the pixel electrode and the common electrode; a first color filter located above the common electrode, the first color filter being green or red; and a second color filter located at a position overlapping the first color filter as seen in a plan view, the second color filter being yellow.

Another embodiment according to the present invention is directed to a display device including a reflection electrode located on a first substrate; a pixel electrode located above the reflection electrode; a common electrode located above the pixel electrode; a light emitting layer located between the pixel electrode and the common electrode; a first color filter located above the common electrode; and a second color filter located between the pixel electrode and the reflection electrode, the second color filter having a color different from a color of the first color filter.

DESCRIPTION OF EMBODIMENTS

Figure 1:
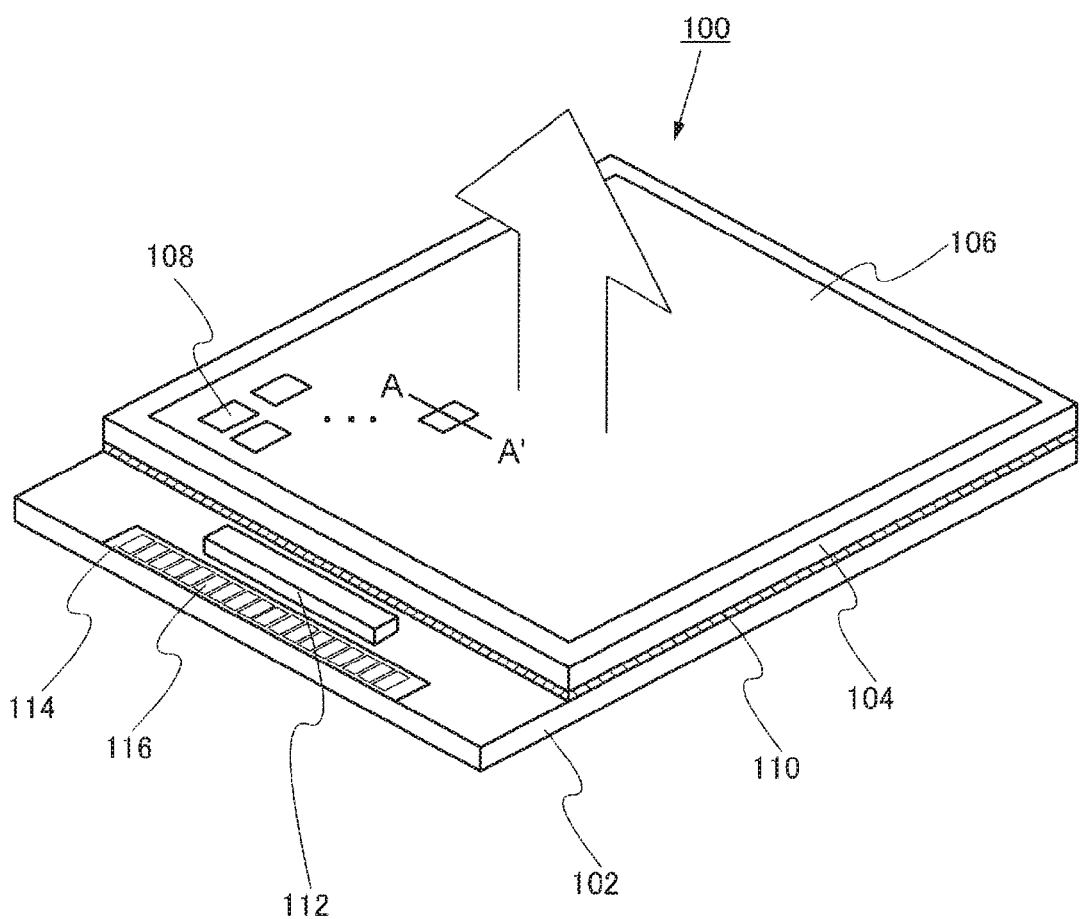
FIG. 1 is a perspective view showing a structure of a display device in an embodiment according to the present invention.

Hereinafter, embodiments of the present invention will be described with reference to the drawings and the like. The present invention may be carried out in various many embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

In this specification, an expression that a component or area is "on" another component or area encompasses a case where such a component or area is in contact with the another component or area and also a case where such a component or area is above or below the another component or area, namely, a case where still another component or area is provided between such a component or area and the another component or area, unless otherwise specified.

EMBODIMENT 1

With reference to FIG. 1, a structure of a display device 100 in this embodiment will be described. FIG. 1 is a perspective view showing the structure of the display device 100 in this embodiment. The display device 100 includes a first substrate 102, on which a display region 106 is provided. The display region 106 includes an array of a plurality of pixels 108. On a top surface of the display region 106, a second substrate 104 is provided as a sealing member. The second substrate 104 is secured to the first substrate 102 by a sealing member 110 enclosing the display region 106. The display region 106 formed on the first substrate 102 is sealed by the second substrate 104 acting as a sealing member and the sealing member 110 so as not to be exposed to air. Such a sealing structure suppresses light emitting elements 124 provided in the pixels 108 from being deteriorated.

The first substrate 102 has a terminal region 114 provided thereon along an end thereof. A driver IC 112 is located in the vicinity of the terminal region 114. The terminal region 114 and the driver IC 112 are located outer to the second substrate 104. The terminal region 114 includes a plurality of connection terminals 116. At each of the connection terminals 116, a wiring board connecting a device that outputs a video signal, a power supply and the like with a display panel is provided. A contact of the connection terminal 116 with the wiring board is exposed outside.

Figure 2:
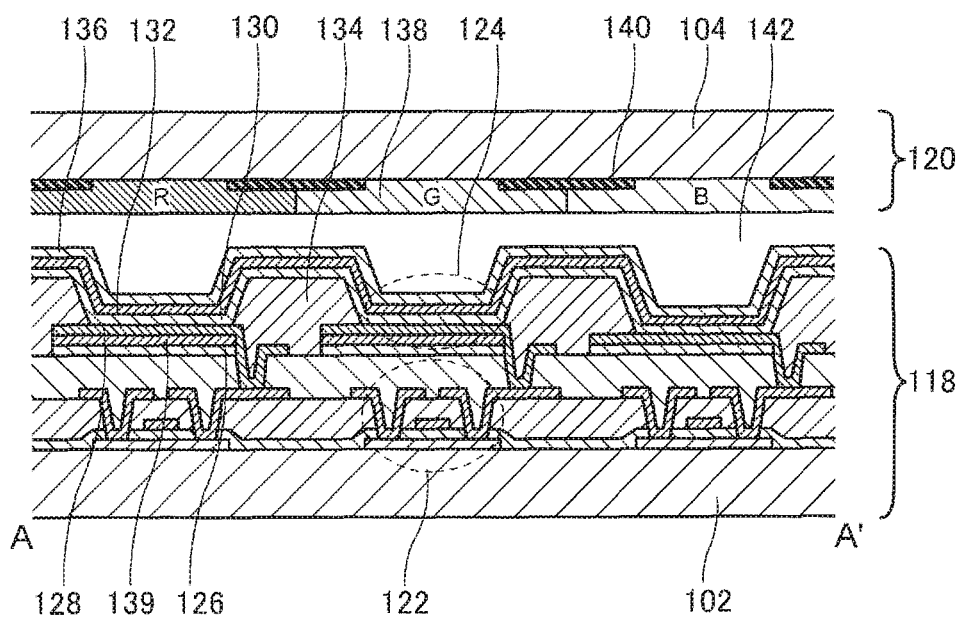
FIG. 2 is a cross-sectional view showing the structure of the display device in the embodiment according to the present invention.
Figure 3:
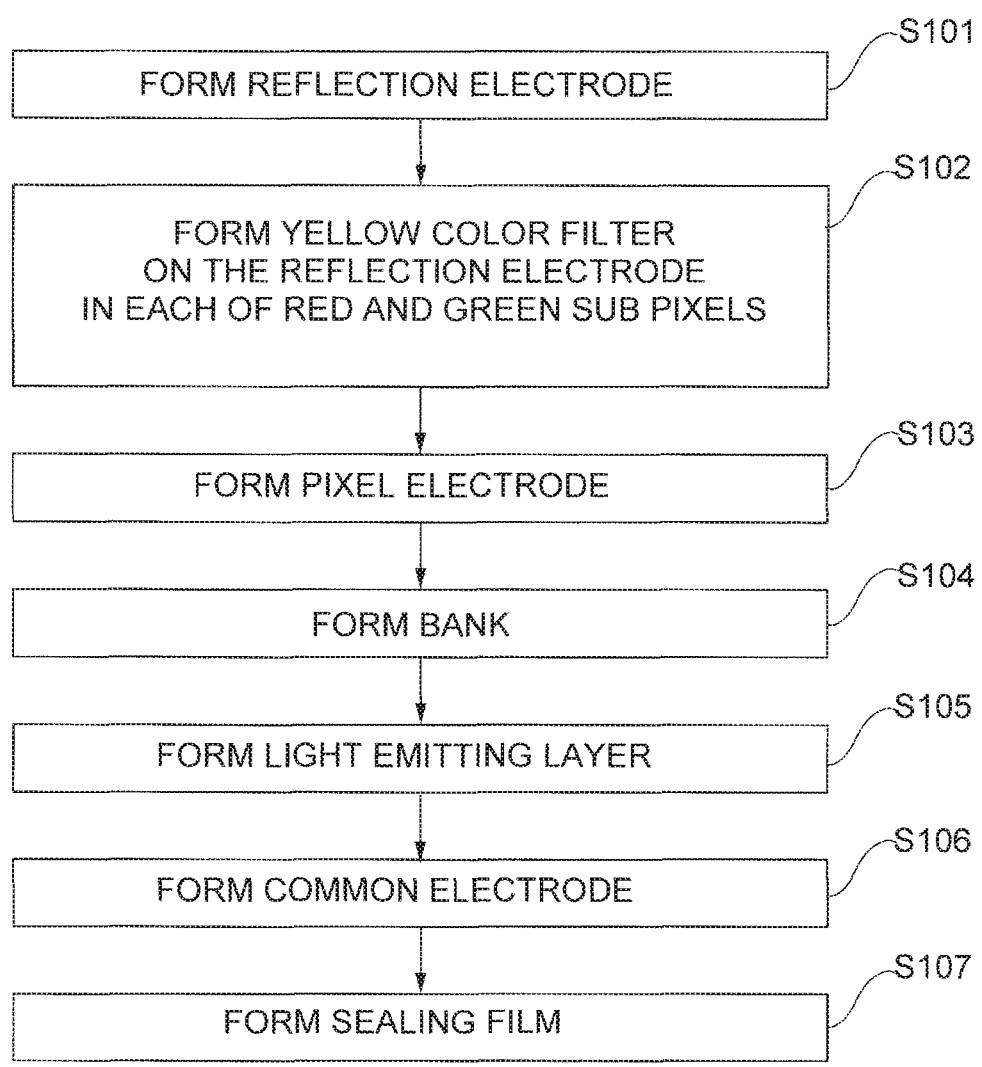
FIG. 3 shows a part of a process for producing the display device in the embodiment according to the present invention.

With reference to FIG. 2 and FIG. 3, the structure of, and a process for producing, the display device 100 in this embodiment will be described. FIG. 2 is a cross-sectional view showing the structure of the display device 100 in this embodiment, taken along line A-A' in FIG. 1. FIG. 2 shows a cross-section of one pixel in the display device 100 in this embodiment. As shown in FIG. 2, the plurality of pixels 108 each include a plurality of sub pixels generating light of at least three different colors. FIG. 3 shows a part of the process for producing the display device 100 in this embodiment.

The display device 100 in this embodiment includes a TFT substrate 118 including thin film transistors 112 and light emitting elements 124, and a color filter substrate (CF substrate) 120 including color filters (CFs) of a plurality of colors. The TFT substrate 118 and the color filter substrate 120 are assembled together.

The TFT substrate 118 includes the first substrate 102 as a support substrate. The TFT substrate 118 also includes the thin film transistors 112, the light emitting elements 124 and a sealing film 136 provided on the first substrate 102.

One light emitting element 124 is located in each of the sub pixels included in the pixel 108. The light emitting element 124 includes a reflection electrode 126, a pixel electrode 128, a light emitting layer 130, and a common electrode 132 stacked in this order from the side of the first substrate 102. The light emitting element 124 is isolated, by a bank 134 provided around the light emitting element 124, from an adjacent light emitting element 124.

The reflection electrode 126 is provided in order to reflect light generated in the light emitting layer 130 toward the common electrode 132. The reflection electrode 126 is preferably formed of a metal material having a high reflectance such as, for example, silver (Ag).

As described below in detail, the display device 100 in this embodiment includes the color filters provided in the CF substrate 120 (such color filters will be referred to as "first color filters 138") and also another type of color filters. In this specification, the another type of color filters will be referred to as "second color filters 139". The display device 100 in this embodiment include a sub pixel in which the second color filter 139 (second CF) is provided in a region overlapping the first color filter 138 (first CF) as seen in a plan view. The term "first" of the first CF 138 merely refers to the color filter provided in the CF substrate 120, and does not refer to a color thereof. The term "second" of the second color filter 139 is used to distinguish the second color filter 139 from the first color filter 138, and does not refer to a color thereof.

The pixel electrode 128 is individually provided in each light-emitting element 124. The pixel electrode 128 is supplied with a potential via the thin film transistor 122, and the pixel electrodes 128 in different light-emitting elements 124 are supplied with different levels of potential. The pixel electrode 128 is preferably formed of a transparent conductive material that is light-transmissive and conductive, for example, ITO (tin oxide-containing indium oxide), IZO (indium oxide-zinc oxide) or the like.

The light emitting layer 130 is commonly provided for the plurality of pixels 108 and covers the pixel electrodes 128 and the bank 134 between the sub pixels.

In the case where the light emitting layer 130 includes an organic EL layer, the organic EL layer is formed of a low molecular weight type organic material or a high molecular weight type organic material. In the case where a low molecular weight type organic material is used, the light emitting layer 130 includes a film containing a light emitting organic material (this film may be occasionally referred to as a "light emitting film") and also a hole injection layer and an electron injection layer, and further a hole transfer layer and an electron transfer layer provided to sandwich the light emitting film.

In this embodiment, the light emitting layer 130 emits white light, and full-color light emission is realized by the first color filters 138.

The light emitting layer 130 may have a so-called tandem structure including a stack a plurality of light emitting layers (e.g., organic EL layers). For example, a light emitting layer generating blue light and a light emitting layer generating yellow light may be stacked to generate white light.

The common electrode 132 is commonly provided for all the light emitting elements 124. The common electrode 132 is preferably formed of a transparent conductive material that is light-transmissive and conductive such as ITO (tin oxide-containing indium oxide), IZO (indium oxide-zinc oxide) or the like in order to allow light emitted in the light emitting layer 130 to be transmitted through the common pixel electrode 132. Alternatively, the common pixel electrode 132 may be formed of a metal layer having such a thickness that allows the light emitted in the light emitting layer 130 to be transmitted through the metal layer.

The sealing film 136 is provided on the common pixel electrode 132. The sealing film 136 is preferably an insulating film that blocks entrance of moisture. Such an insulating film may be an inorganic insulating film or an organic insulating film.

In the case where the sealing film 136 is formed of an inorganic insulating film, the sealing film 136 may be formed of silicon oxide (SiOx), silicon nitride (SiNx), silicon oxide nitride (SiOxNy), silicon nitride oxide (SiNxOy), aluminum oxide (AlOx), aluminum nitride (AlNx), aluminum oxide nitride (AlOxNy), aluminum nitride oxide (AlNxOy) or the like (x and y are each an arbitrary value). The sealing film 136 may have a stack structure of any of these materials. The sealing film 136 formed of such an inorganic material(s) may be formed by plasma CVD or sputtering.

In the case where the sealing film 136 is formed of an organic insulating film, the sealing film 136 may be formed of a polyimide resin, an acrylic resin, an epoxy resin, a silicone resin, a fluorine resin, a siloxane resin or the like.

The sealing film 136 may have a stack structure of any of these materials. The sealing film 136 formed of such an organic material(s) may be formed by vapor deposition or vapor deposition polymerization.

The sealing film 136 may have a stack structure of a combination of any of the above-described inorganic and organic insulating materials.

Now, the CF substrate 120 will be described. The CF substrate 120 includes the second substrate 104 as a support substrate, and also includes the first CFs 138 of at least three colors of R (red), G (green) and B (blue) arranged side by side and a light blocking layer 140 demarcating the first CFs 138. The first CFs 138 and the light blocking layer 140 are provided in a region corresponding to the display region 106. The light blocking layer 140 is provided to prevent light leak between the sub pixels and thus to prevent a display degradation such as color mixing or the like.

The TFT substrate 118 and the CF substrate 120 are assembled together with the sealing member 110. The sealing member 110 is located to enclose the region corresponding to the display region 106. A space enclosed by the sealing member 110 is filled with a filler 142. The light emitting elements 124 formed in the display region 106 are sealed by the filler 142 and the sealing member 110 so as not to be exposed to air. Such a sealing structure suppresses the light emitting elements 124 from being deteriorated. The filler 142 may be formed of, for example, a material containing an epoxy resin, which is transparent.

Now, the structure of the pixel 108 of the display device 100 in this embodiment described above will be described in more detail. In the display device 100 in this embodiment, each of the sub pixels included in each pixel 108 includes the first CF 138 included in the CF substrate 120. More specifically, the first CF 138 is located between the filler 142 and the second substrate 104. The second CF 129 of a color different from that of the first CF 138 is located in a region overlapping the first CF 138 as seen in a plan view. Namely, the first CF 138 and the second CF 139 transmit light components of different wavelength ranges from each other. It is preferable that the wavelength range of the light component transmitted through the first CF 138 and the wavelength range of the light component transmitted through the second CF 139 partially overlap each other. The second CF 139 does not need to be provided in all the sub pixels, and there may be a sub pixel in which the second CF 139 is not provided.

In the display device 100 in this embodiment shown in FIG. 2, each of the sub pixels included in each pixel 108 includes the first CF 138 of red (R), green (G) or blue (B). The second CF 139 of yellow (Y) is located in a region overlapping at least one of the red (R) first CF 138 and the green (G) first CF 138. In this example, the second CF 139 is located in the sub pixel including the green first CF 138 and the sub pixel including the red first CF 138 adjacent to each other. The second CF 139 is not provided in the sub pixel including the blue (B) first CF 138.

In the cross-sectional structure of the display device 100 in this embodiment shown in FIG. 2, the yellow (Y) second CF 139 is located between the reflection electrode 126 and the pixel electrode 128.

The position of the yellow (Y) second CF 139 in the cross-sectional structure is not limited to between the reflection electrode 126 and the pixel electrode 128, and may be any position on the side of the CF substrate 120 with respect to the reflection electrode 126 as shown in FIG. 2.

Figure 4:
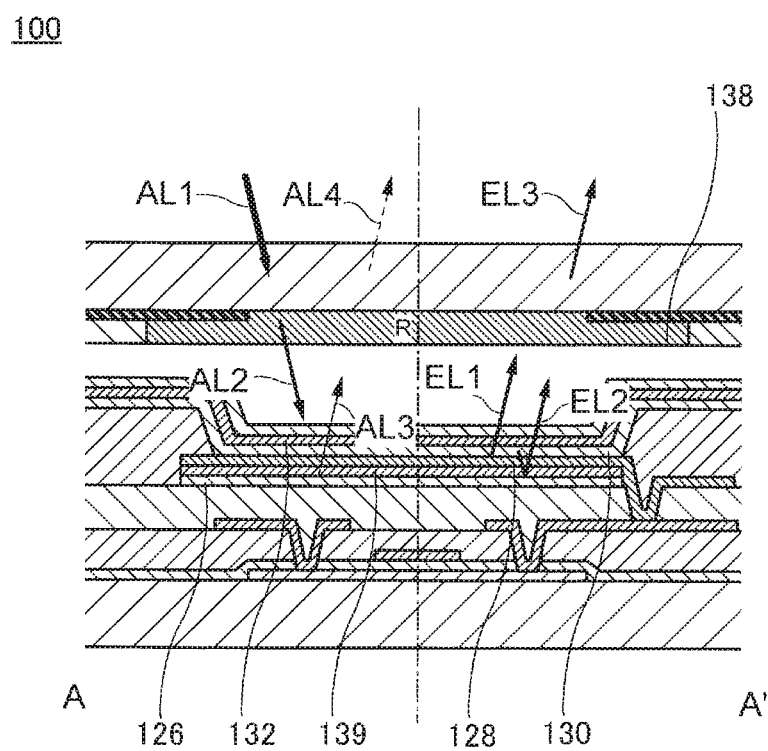
FIG. 4 is a cross-sectional view provided to explain a mechanism by which the display device in the embodiment according to the present invention alleviates external light reflection.

Functions and effects of the above-described structure of the pixel 108 will be described in detail with reference to FIG. 4 and FIG. 5. FIG. 4 is a cross-sectional view provided to explain the mechanism by which the display device 100 in this embodiment alleviates the external light reflection. FIG. 5 is provided to explain spectra of light inside and outside the display device 100 in this embodiment.

In FIG. 4, AL1 refers to external light incident on the display device 100 from outside. The external light AL1 is natural light, and is white light containing light of a wide wavelength range (solid line in FIG. 5A).

AL2 refers to light, of the external light AL1, that has passed the red first CF 138, and is red light. As a result of the external light AL1 passing red first CF 138, light components other than a red light component is damped (solid line in FIG. 5B).

AL3 refers to light, of the red light AL2, that has passed the yellow second CF 139 and is reflected by the reflection electrode 126. A spectrum of light visually recognized as red light and a spectrum of light visually recognized as yellow light partially overlap each other. Namely, light visually recognized as red light and light visually recognized as yellow light include a light component of the same wavelength range. As a result of the red light AL2 passing the yellow second CF 139, only the light component of the same wavelength range remains, and light components of the rest of the wavelength range are damped (solid line in FIG. 5C). As can be seen, provision of the yellow second CF 139 in addition to the red first CF 138 alleviates light, in the external light AL1 incident on the display device 100, that is reflected by the reflection electrode 126.

Figure 5A:
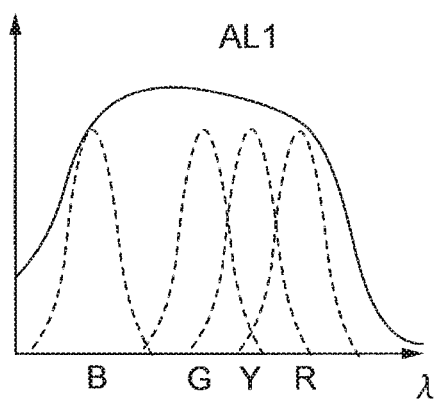
FIG. 5A shows spectra of light inside and outside the display device in the embodiment according to the present invention.
Figure 5B:
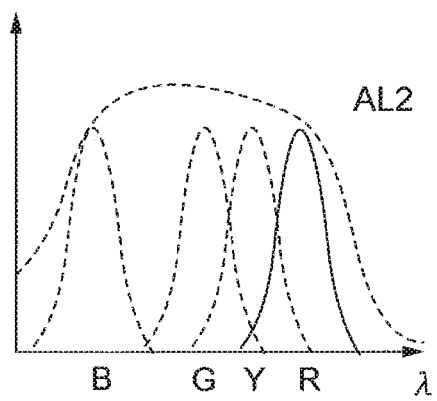
FIG. 5B shows spectra of light inside and outside the display device in the embodiment according to the present invention.
Figure 5C:
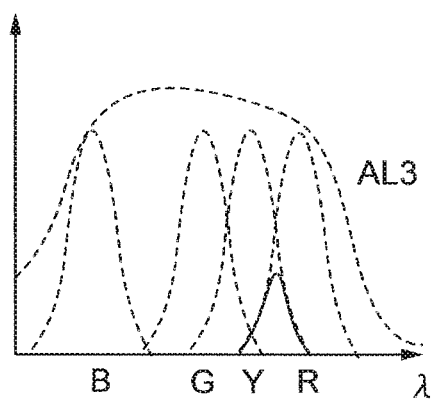
FIG. 5C shows spectra of light inside and outside the display device in the embodiment according to the present invention.
Figure 5D:
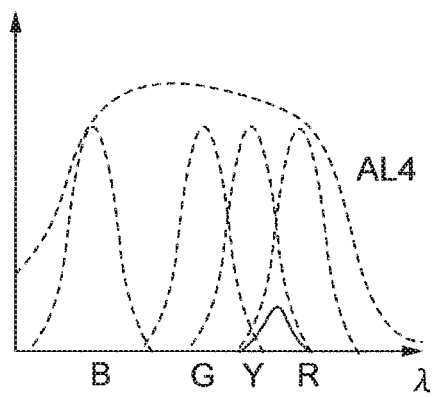
FIG. 5D shows spectra of light inside and outside the display device in the embodiment according to the present invention.

As a result of passing the red first CF 138 again, the light AL2 damped by the yellow second CF 139 is further damped to be light AL4 (solid line in FIG. 5D).

The above-described mechanism alleviates the display degradation caused by the external light reflection by the reflection electrode 126.

In this embodiment, the first CF 138 is a red filter and the second CF 139 is a yellow filter. The colors of the first CF 138 and the second CF 139 are not limited to these. It is sufficient that the color of the first CF 138 and the color of the second CF 139 are different from each other. Namely, it is sufficient that the second CF 139 is of a color that blocks a light component of at least a part of the wavelength range of the light which has passed the first CF 138. For example, the second CF 139 may be formed in a white sub pixel. Such a structure alleviates the external light reflection by the above-described mechanism.

Figure 5E:
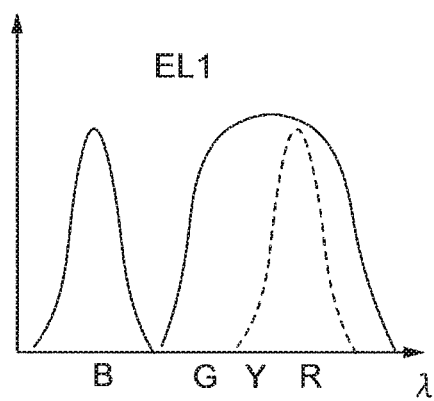
FIG. 5E shows spectra of light inside and outside the display device in the embodiment according to the present invention.
Figure 5F:
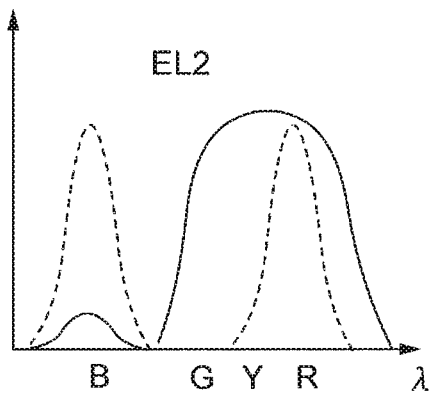
FIG. 5F shows spectra of light inside and outside the display device in the embodiment according to the present invention.
Figure 5G:
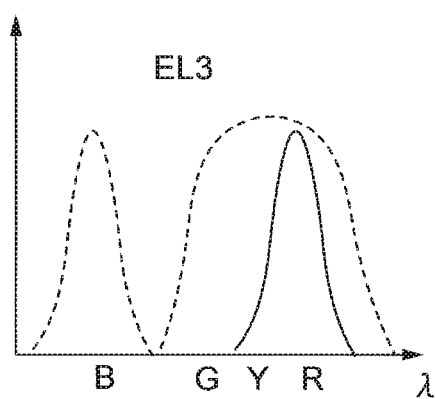
FIG. 5G shows spectra of light inside and outside the display device in the embodiment according to the present invention.

In FIG. 4, EL1 refers to white light generated in the light emitting layer 130 (solid line in FIG. 5E). EL2 refers to light, of the white light EL1 generated in the light emitting layer 130, that has passed the yellow second CF 139 and is reflected by the reflection electrode 126 (solid line in FIG. 5F). The white light generated in the light emitting layer 130 may be divided into blue light and yellow light. Among the blue light and the yellow light, only the blue light is blocked by the yellow second CF 139 (solid line in FIG. 5G). The blue light has a shorter wavelength than that of the red light, and the overlap of spectrum of the blue light and the spectrum of the red light is small. Therefore, light EL3 that has passed the red first CF 138 to go out of the display device 100, of the light EL2, is not much different regardless of whether the yellow second CF 139 is present or not. Namely, the light EL3 is substantially the same even in a structure not including the yellow second CF 139.

As can be seen, the second CF 139 of the display device 100 in this embodiment contributes to alleviating the external light reflection, but has almost no influence on the light generated in the light emitting layer 130 and visually recognized by the observer.

The structure of the display device 100 in this embodiment has been described. The display device 100 in this embodiment alleviates the display degradation caused by the external light reflection by the reflection electrode 126.

A part of the process for producing the display device 100 in this embodiment will be described with reference to FIG. 3.

The display device 100 is produced as follows, for example. As shown in FIG. 3, the reflection electrode 126 is formed (S101). Next, the yellow second CF 139 is formed on the reflection electrode 126 in each of the red and green sub pixels (S102). Next, the pixel electrode 128 is formed in each of the plurality of sub pixels (S103). Then, the bank 134 demarcating the pixel electrodes 128 and covering an end of each of the pixel electrodes 128 is formed (S104). Next, the light emitting layer 130 is formed so as to cover the pixel electrodes 128 and the bank 134 located in the display region 106 (S105). The light emitting layer 130 may be formed so as to be located in the entirety of the display region 106, or may be patterned so as to be located in each of the sub pixels individually. Next, the common electrode 132 is formed of a transparent material so as to be located in the plurality of sub pixels (S106). Then, the sealing film 136 is formed on the entirety of the display region 106 (S107).

EMBODIMENT 2

Figure 6:
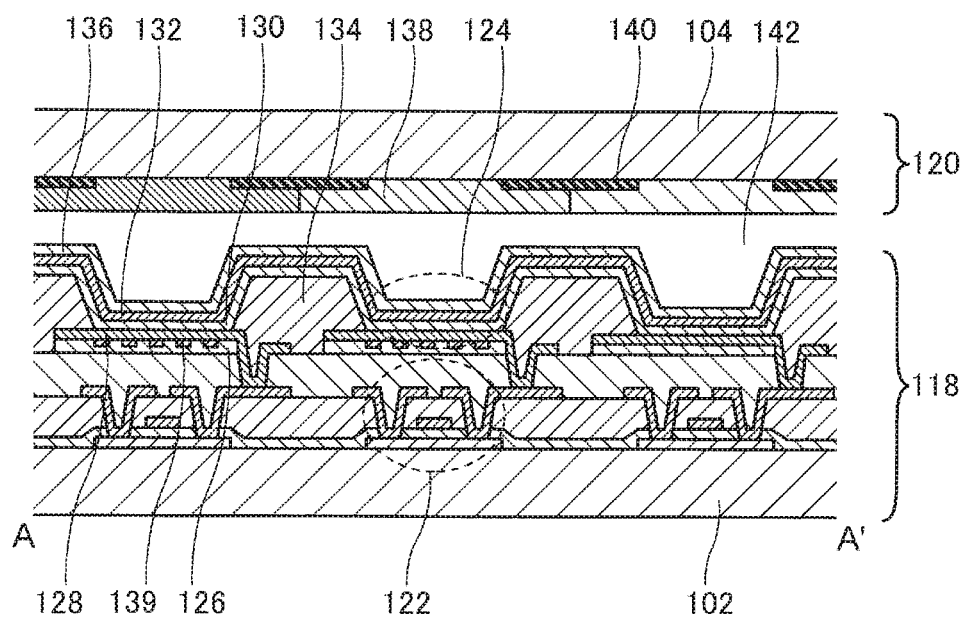
FIG. 6 is a cross-sectional view showing a structure of a display device in an embodiment according to the present invention.
Figure 7:
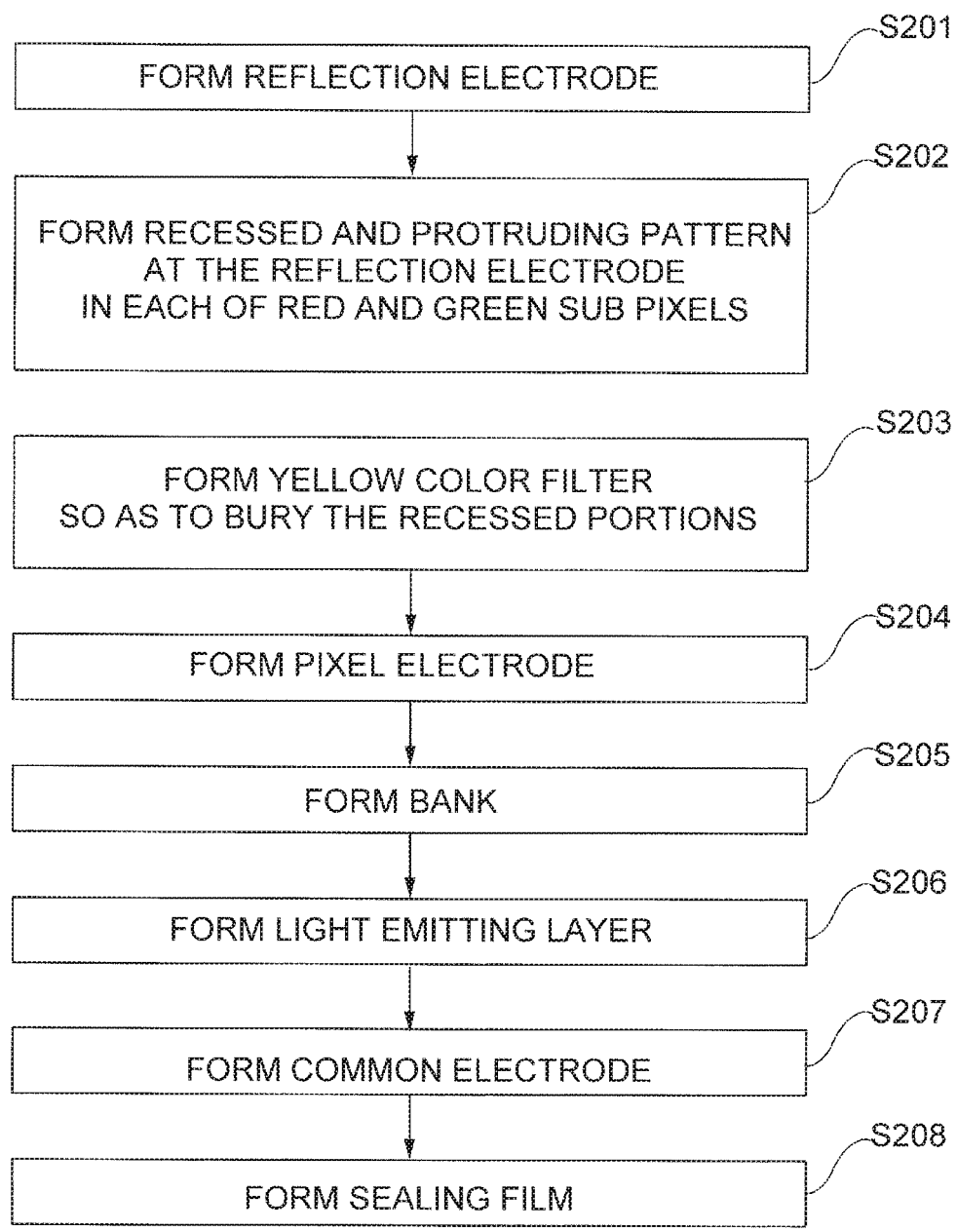
FIG. 7 shows a part of a process for producing the display device in the embodiment according to the present invention.

With reference to FIG. 6 and FIG. 7, a structure of, and a process for producing, a display device 200 in this embodiment will be described in detail. The display device 200 in this embodiment has substantially the same external appearance as that of the display device 100 shown in FIG. 1. FIG. 6 is a cross-sectional view showing the structure of the display device 200 in this embodiment. FIG. 6 corresponds to the cross-sectional view taken along line A-A' in FIG. 1. FIG. 6 shows a cross-section of one pixel in the display device 200 in this embodiment. FIG. 7 shows a part of the process for producing the display device 200 in this embodiment.

The display device 200 in this embodiment is different from the display device 100 in embodiment 1 in the structure of the second CF 139 and the reflection electrode 126. Specifically, in the display device 200 in this embodiment, the reflection electrode 126 includes a plurality of recessed portions on the side of the second substrate 104. In other words, a surface of the reflection electrode 126 on the side of the second substrate 104 has a recessed and protruding pattern.

The second CF 139 may be located so as to be at least embedded in the recessed portions. In this example, the second CF 139 is located so as to be only embedded in the recessed portions. Alternatively, the second CF 139 may also be located on the protruding portions of the reflection electrode 126.

Such a structure of the pixel 108 activates light scattering at an interface between the reflection electrode 126 having the recessed and protruding pattern and the second CF 139. Therefore, among the light generated in the light emitting layer 130 and reflected by the reflection electrode 126, light that is not reflected toward the CF substrate 120, namely, toward the display screen, is suppressed. In this manner, the display device 200 in this embodiment improves the light extraction efficiency.

A part of the process for producing the display device 200 in this embodiment will be described with reference to FIG. 7.

The display device 200 is produced as follows, for example. A metal layer that is to be the reflection electrode 126 is formed, and is patterned by photolithography to form the reflection electrode 126 in each of the sub pixels (S201).

Next, the recessed and protruding patter is formed at the surface of the reflection electrode 126 in each of the red and green sub pixels by photolithography (S202). The metal layer that is to be the reflection electrode 126 may include at least two metal layers. In this case, only the upper layer may be pattered by using the difference between etching rates of the two metal layers.

Next, the yellow second CF 139 is formed so as to bury the recessed portions at the surface of the reflection electrode 126 (S203).

Next, the pixel electrode 128 is formed in each of the plurality of sub pixels (S204). Then, the bank 134 demarcating the pixel electrodes 128 and covering an end of each of the pixel electrodes 128 is formed (S205). Next, the light emitting layer 130 is formed so as to cover the pixel electrodes 128 and the bank 134 located in the display region 106 (S206). The light emitting layer 130 may be formed so as to be located in the entirety of the display region 106, or may be pattered so as to be located in each of the sub pixels independently. Next, the common electrode 132 is formed of a transparent material so as to be located in the plurality of sub pixels (S207). Then, the sealing film 136 is formed on the entirety of the display region 106 (S208).

The display device 200 in this embodiment has been described. The display device 200 in this embodiment includes the second CF 139 of a color different from that of the first CF 138, and thus alleviates the display degradation caused by the external light reflection by the reflection electrode 126. In addition, the display device 200 in this embodiment includes the recessed and protruding pattern at the interface between the reflection electrode 126 and the second CF 139, and thus activates light scattering at the interface and improves the light extraction efficiency.

EMBODIMENT 3

Figure 8:
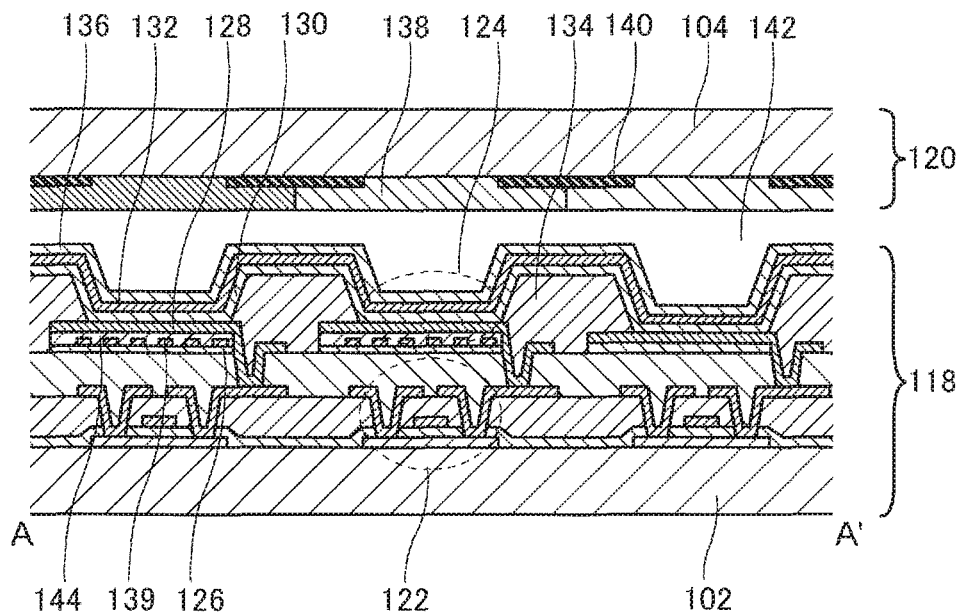
FIG. 8 is a cross-sectional view showing a structure of a display device in an embodiment according to the present invention.
Figure 9:
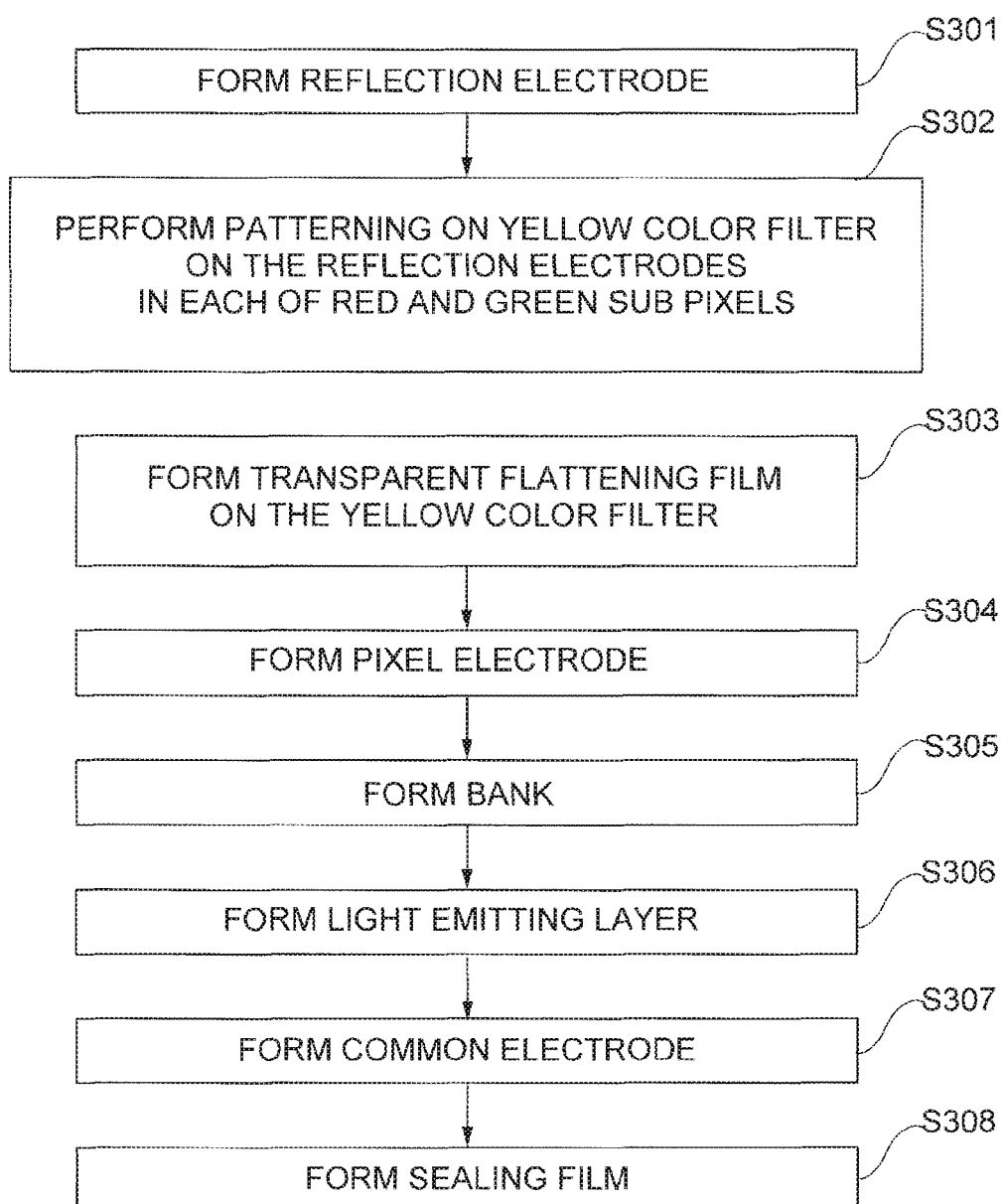
FIG. 9 shows a part of a process for producing the display device in the embodiment according to the present invention.

With reference to FIG. 8 and FIG. 9, a structure of, and a process for producing, a display device 300 in this embodiment will be described in detail. The display device 300 in this embodiment has substantially the same external appearance as that of the display device 100 shown in FIG. 1. FIG. 8 is a cross-sectional view showing the structure of the display device 300 in this embodiment. FIG. 8 corresponds to the cross-sectional view taken along line A-A' in FIG. 1. FIG. 8 shows a cross-section of one pixel in the display device 300 in this embodiment. FIG. 9 shows a part of the process for producing the display device 300 in this embodiment.

The display device 300 in this embodiment is different from the display device 100 in embodiment 1 in the structure of the second CF 139 and the reflection electrode 126. Specifically, in the display device 300 in this embodiment, the second CF 139 has a recessed and protruding pattern. The recessed and protruding pattern may expose the reflection electrode 126. Namely, as shown in FIG. 8, the second CF 139 may be located in a discrete manner in one sub pixel. The recessed and protruding pattern does not need to expose the reflection electrode 126.

The display device 300 in this embodiment includes a transparent flattening film 144 provided so as to cover the second CF 139 having the recessed and protruding pattern. The transparent flattening film 144 may be formed of, for example, a polyimide-based organic resin, an acrylic organic resin or an organic resin of any other appropriate type.

On the transparent flattening film 144, the pixel electrode 128 formed of a transparent material is provided.

Such a structure of the pixel 108 activates light scattering at the recessed and protruding pattern at an interface between the second CF 139 and the transparent flattening film 144. In this manner, the display device 300 in this embodiment improves the light extraction efficiency.

A part of the process for producing the display device 300 in this embodiment will be described with reference to FIG. 9.

The display device 300 is produced as follows, for example. As shown in FIG. 9, the reflection electrode 126 is formed (S301). Next, the yellow second CF 139 is formed on the reflection electrode 126, and the second CF 139 on the reflection electrode 126 is patterned so as to include a plurality of recessed and protruding portions (S302).

Next, the transparent flattening film 144 is formed on the reflection electrode 126 and the second CF 139 so as to cover the second CF 139 having the recessed and protruding patter and thus to form a flat surface (S303). The transparent flattening film 144 may be formed of a polyimide-based organic resin, an acrylic organic resin or an organic resin of any other appropriate type.

Next, the pixel electrode 128 is formed in each of the plurality of sub pixels (S304). Then, the bank 134 demarcating the pixel electrodes 128 and covering an end of each of the pixel electrodes 128 is formed (S305). Next, the light emitting layer 130 is formed so as to cover the pixel electrodes 128 and the bank 134 located in the display region 106 (S306). The light emitting layer 130 may be formed so as to be located in the entirety of the display region 106, or may be patterned so as to be located in each of the sub pixels independently. Next, the common electrode 132 is formed of a transparent material so as to be located in the plurality of sub pixels (S307). Then, the sealing film 136 is formed on the entirety of the display region 106 (S308).

The display device 300 in this embodiment has been described. The display device 300 in this embodiment includes the second CF 139 of a color different from that of the first CF 138, and thus alleviates the display degradation caused by the external light reflection by the reflection electrode 126. In addition, the display device 300 in this embodiment includes the second CF 139 having a recessed and protruding pattern, and thus activates light scattering at the recessed and protruding pattern and improves the light extraction efficiency.

EMBODIMENT 4

Figure 10:
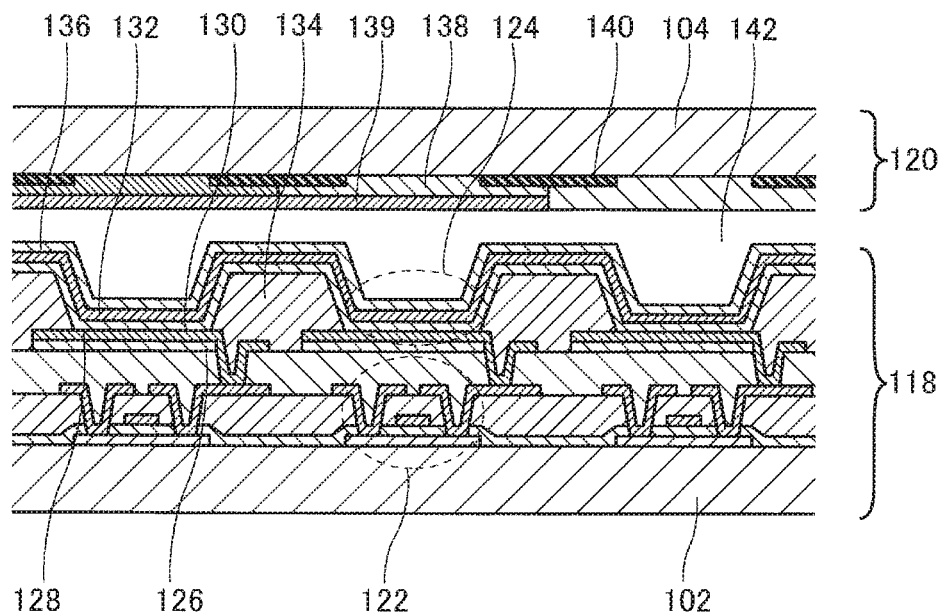
FIG. 10 is a cross-sectional view showing a structure of a display device in an embodiment according to the present invention.

With reference to FIG. 10, a structure of a display device 400 in this embodiment will be described in detail. The display device 400 in this embodiment has substantially the same external appearance as that of the display device 100 shown in FIG. 1. FIG. 10 is a cross-sectional view showing the structure of the display device 300 in this embodiment. FIG. 10 corresponds to the cross-sectional view taken along line A-A' in FIG. 1. FIG. 10 shows a cross-section of one pixel in the display device 400 in this embodiment.

The display device 400 in this embodiment is different from the display device 100 in embodiment 1 in the location of the second CF 139. Specifically, in the display device 400 in this embodiment, the second CF 139 is located in the CF substrate 120. More specifically, the second CF 139 is located between the filler 142 and the second substrate 104.

The second CF 139 is continuously located in the sub pixel including the red first CF 138 and the sub pixel including the green first CF 138 adjacent to the red first CF 138.

In this example, the second CF 139 is located in contact with the first CF 138. The second CF 139 is not limited to being located in this manner. It is sufficient that the first CF 138 and the second CF 139 overlap each other as seen in a plan view.

Figure 11:
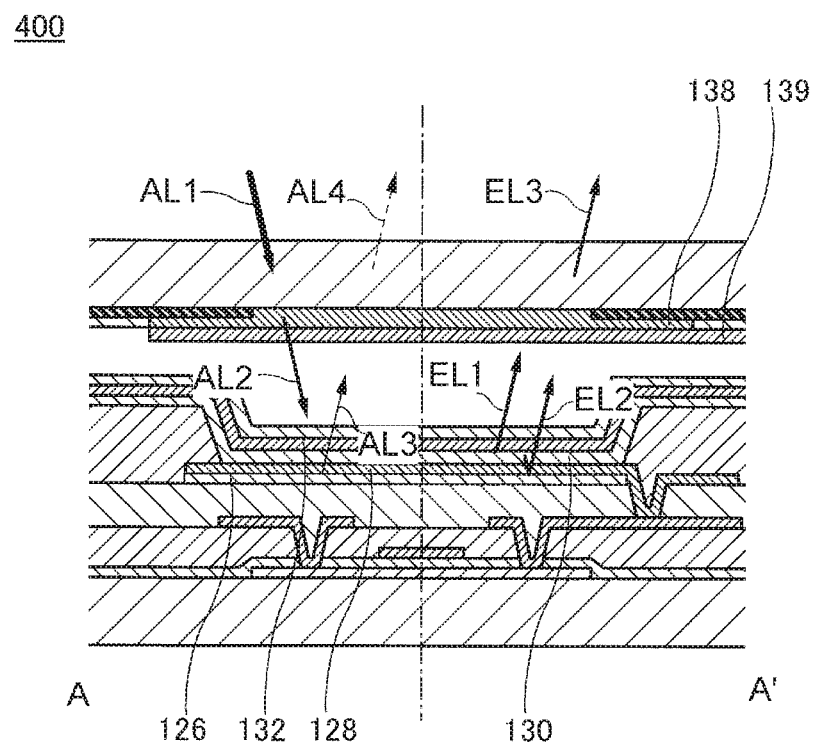
FIG. 11 is a cross-sectional view provided to explain a mechanism by which the display device in the embodiment according to the present invention alleviates external light reflection.

Functions and effects of the above-described structure of the pixel 108 will be described in detail with reference to FIG. 11 and FIG. 12. FIG. 11 is a cross-sectional view provided to explain the mechanism by which the display device 400 in this embodiment alleviates the external light reflection. FIG. 12 is provided to explain spectra of light inside and outside the display device 400 in this embodiment.

In FIG. 11, AL1 refers to external light incident on the display device 400 from outside. The external light AL1 is natural light, and is white light containing light of a wide wavelength range (solid line in FIG. 12A).

AL2 refers to light, of the external light AL1, that has passed the red first CF 138 and the yellow second CF 139.

As a result of the external light AL1 passing red first CF 138, light components other than a red light component are damped. Then, as a result of the resultant light passing the yellow second CF 139, light components other than a yellow light component are damped. A spectrum of light visually recognized as red light and a spectrum of light visually recognized as yellow light partially overlap each other. Namely, light visually recognized as red light and light visually recognized as yellow light include a light component of the same wavelength range. As a result of the red light passing the yellow second CF 139, only the light component having the same wavelength range remains, and light components of the rest of the wavelength range are damped (solid line in FIG. 12B). Namely, provision of the yellow second CF 139 in addition to the red first CF 138 significantly alleviates the external light incident on the display device 400.

Figure 12A:
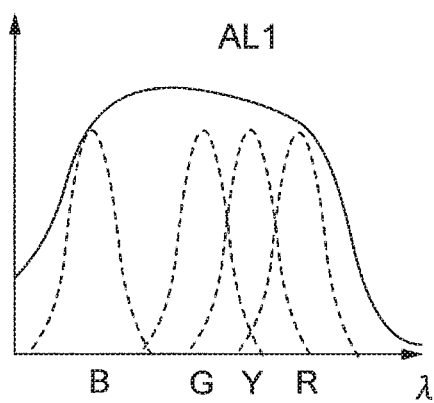
FIG. 12A shows spectra of light inside and outside the display device in the embodiment according to the present invention.
Figure 12B:
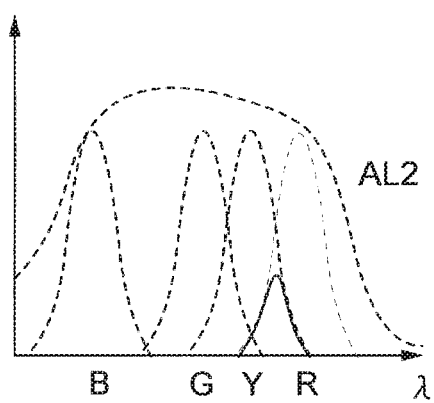
FIG. 12B shows spectra of light inside and outside the display device in the embodiment according to the present invention.
Figure 12C:
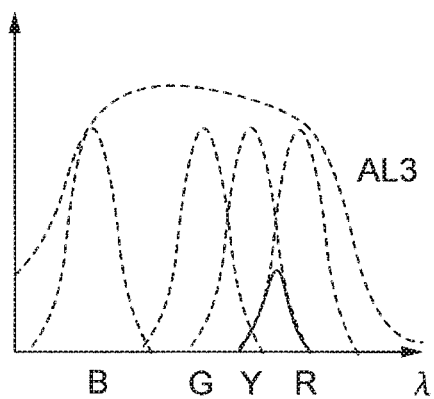
FIG. 12C shows spectra of light inside and outside the display device in the embodiment according to the present invention.

The light AL2 damped by the red first CF 138 and the yellow second CF 139 is reflected by the reflection electrode 126 to be reflected light AL3 (solid line in FIG. 12C).

Figure 12D:
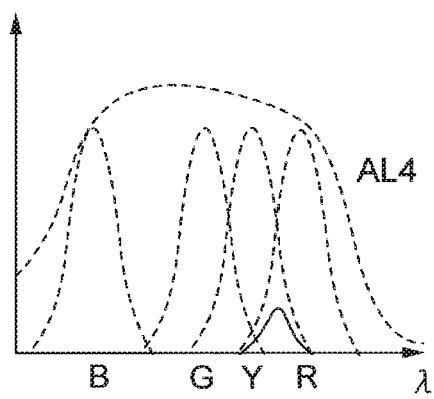
FIG. 12D shows spectra of light inside and outside the display device in the embodiment according to the present invention.
Figure 12E:
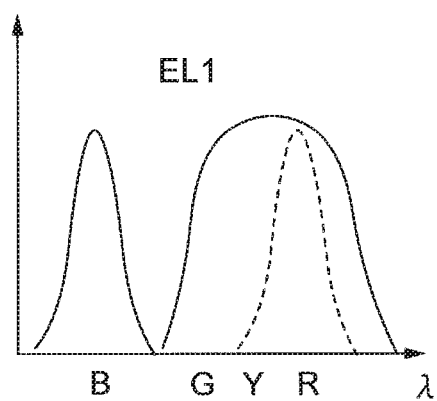
FIG. 12E shows spectra of light inside and outside the display device in the embodiment according to the present invention.
Figure 12F:
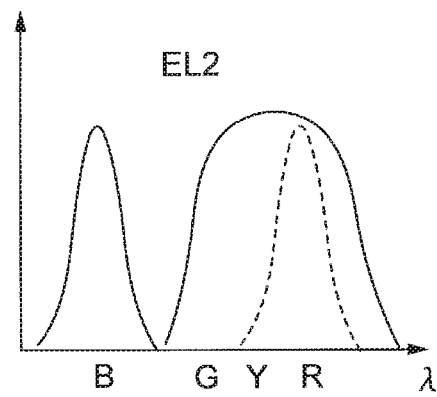
FIG. 12F shows spectra of light inside and outside the display device in the embodiment according to the present invention.
Figure 12G:
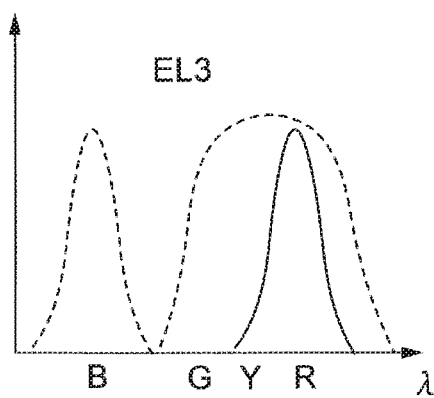
FIG. 12G shows spectra of light inside and outside the display device in the embodiment according to the present invention.

As a result of passing the yellow CF 139 and the red first CF 138 again, the light AL3 is further damped to be light AL4 (solid line in FIG. 12D).

The above-described mechanism alleviates the display degradation caused by the external light reflection by the reflection electrode 126.

In this embodiment, the first CF 138 is a red filter and the second CF 139 is a yellow filter. The colors of the first CF 138 and the second CF 139 are not limited to these. It is sufficient that the color of the first CF 138 and the color of the second CF 139 are different from each other. Namely, it is sufficient that the second CF 139 is of a color that blocks a light component of at least a part of the wavelength range of the light which has passed the first CF 138. For example, the second CF 139 may be a white filter. Such a structure alleviates the external light reflection by the above-described mechanism.

In FIG. 11, EL1 refers to white light generated in the light emitting layer 130 (solid line in FIG. 11(e)). EL2 refers to light, of the white light EL1 generated in the light emitting layer 130, that is reflected by the reflection electrode 126 (solid line in FIG. 12F).

EL3 refer to light, of EL1 and EL2, that has passed the yellow second CF 139 and the red first CF 138. The white light generated in the light emitting layer 130 may be divided into blue light and yellow light. Among the blue light and the yellow light, only the blue light is blocked by the yellow second CF 139 (solid light in FIG. 12G). The blue light has a shorter wavelength than that of the red light, and the spectrum of the blue light and the spectrum of the red light do not much overlap each other. Therefore, the light EL3, of the light EL2, that has passed the yellow second CF 139 and the red first CF 138 to go out of the display device 400 is not much different regardless of whether the yellow second CF 139 is present or not. Namely, the light EL3 is substantially the same even in a structure not including the yellow second CF 139.

As can be seen, the second CF 139 of the display device 400 in this embodiment contributes to alleviating the external light reflection, but has almost no influence on the light generated in the light emitting layer 130 and visually recognized by the observer.

The structure of the display device 400 in this embodiment has been described. The display device 400 in this embodiment alleviates a display degradation caused by the external light reflection by the reflection electrode 126.

Some preferable embodiments of the present invention have been described in embodiments 1 through 4. These embodiments are merely examples, and the technological scope of the present invention is not limited to any of these embodiments. A person of ordinary skill in the art would make various alterations without departing from the gist of the present invention. Therefore, such alterations are to be construed to be encompassed in the technological scope of the present invention.

The invention claimed is:

1. A display device, comprising:
   a reflection electrode located on a first substrate;
   a pixel electrode located above the reflection electrode;
   a common electrode located above the pixel electrode;
   a light emitting layer located between the pixel electrode and the common electrode;
   a first color filter located above the common electrode, the first color filter being green or red; and
   a second color filter located at a position overlapping the first color filter as seen in a plan view, the second filter color being yellow.

2. The display device according to claim 1, wherein the second color filter is located in contact with the first color filter.

3. The display device according to claim 1, further comprising:
   a second substrate located to face the first substrate; and
   a filler located above the common electrode and held between the first substrate and the second substrate;
   wherein the first color filter is located between the filler and the second substrate.

4. The display device according to claim 3, wherein the second color filter is located between the filler and the second substrate.

5. The display device according to claim 3, wherein the second color filter is located continuously in a first sub pixel including the first color filter of green and a second sub pixel adjacent to the first sub pixel, the second sub pixel including the first color filter of red.

6. The display device according to claim 1, wherein the second color filter is located between the reflection electrode and the pixel electrode.

7. The display device according to claim 1, wherein the light emitting layer emits white light.

8. The display device according to claim 1, wherein the light emitting layer includes a first light emitting layer emitting blue light and a second light emitting layer emitting yellow light.

9. A display device, comprising:
- a reflection electrode located on a first substrate;
- a pixel electrode located above the reflection electrode;
- a common electrode located above the pixel electrode;
- a light emitting layer located between the pixel electrode and the common electrode;
- a first color filter located above the common electrode; and
- a second color filter located between the pixel electrode and the reflection electrode, the second color filter having a color different from a color of the first color filter.

10. The display device according to claim 9, wherein the first color filter is green or red, and the second color filter is yellow.

11. The display device according to claim 9, wherein the light emitting layer emits white light.

12. The display device according to claim 9, wherein the light emitting layer includes a first light emitting layer emitting blue light and a second light emitting layer emitting yellow light.

13. The display device according to claim 9, further comprising:
- a second substrate located to face the first substrate; and
- a filler located above the common electrode and held between the first substrate and the second substrate;
- wherein the first color filter is located between the filler and the second substrate.

14. The display device according to claim 9, wherein:
- the reflection electrode has a recessed portion on the side of the second substrate; and
- the second color filter is located in the recessed portion.

15. The display device according to claim 9, wherein the second color filter has a recessed and protruding pattern.

16. The display device according to claim 9, wherein the first color filter has a region overlapping the second color filter as seen in a plan view.

17. The display device according to claim 9, comprising a plurality of sub pixels each including the reflection electrode, the pixel electrode, the common electrode and the light emitting layer;
- wherein the plurality of sub pixels include:
  - a first sub pixel including the first color filter and the second color filter; and
  - a second sub pixel including a third color filter located above the common electrode, the third color filter having a color different from a color of each of the first color filter and the second color filter; and
- the second sub pixel does not include the second color filter.

18. The display device according to claim 17, wherein:
the first color filter is green or red;
the second color filter is yellow; and
the third color filter is blue.

19. The display device according to claim 17, wherein:
a wavelength range of light transmitted through the first color filter and a wavelength range of light transmitted through the second color filter have an overlapping region; and
a wavelength range of light transmitted through the third color filter and the wavelength range of the light transmitted through the second color filter do not overlap each other.

* * * * *